United States Patent [19]

Hellwarth et al.

[11] 3,818,246

[45] June 18, 1974

[54] SWITCHING CIRCUITS PARTICULARLY USEFUL FOR ANALOG-TO-DIGITAL CONVERTERS

[75] Inventors: George A. Hellwarth, Deerfield Beach; James E. Milton, Boca Raton, both of Fla.

[73] Assignee: International Business Machines Corporation, Armonk, N.Y.

[22] Filed: Dec. 11, 1972

[21] Appl. No.: 313,895

Related U.S. Application Data

[62] Division of Ser. No. 131,748, April 6, 1971, Pat. No. 3,733,600.

[52] U.S. Cl. .................... 307/251, 328/151, 330/9, 340/347 AD, 340/347 NT

[51] Int. Cl.. H03k 17/60, H03k 5/153, H03k 13/02

[58] Field of Search .......... 307/251, 248, 246, 260; 332/18, 19; 330/9; 328/151

[56] References Cited

UNITED STATES PATENTS

| | | | |
|---|---|---|---|
| 3,145,349 | 8/1964 | Turrell | 332/18 |
| 3,350,651 | 10/1967 | Davis | 328/155 |
| 3,509,460 | 4/1970 | Mizrahi | 330/9 |
| 3,541,320 | 11/1970 | Beall | 330/9 |
| 3,586,880 | 6/1971 | Fitzwater | 307/251 |
| 3,697,891 | 10/1972 | Shade | 330/9 |
| 3,723,763 | 3/1973 | Udovic | 307/251 |

*Primary Examiner*—Rudolph V. Rolinec
*Assistant Examiner*—L. N. Anagnos
*Attorney, Agent, or Firm*—Earl C. Hancock; Carl W. Laumann, Jr.; J. Jancin, Jr.

[57] ABSTRACT

Time delays associated with switching controls of analog-to-digital converter circuits permit switching transients to be blocked from reducing conversion accuracy. The time delays allow switching to be performed while normal conversion operations are suspended. Appropriate converter components are maintained with quiescent operating levels between conversion cycles so that drifting of those components during conversion cycles is minimized. At least the final portion of a simulated conversion cycle is used as a precedent to each conversion cycle so that the initiating and completing conversion levels are maintained equivalent. A precision semiconductor switch effects on-off switching with constant resistance by referencing the switch control signals to the switch input level.

3 Claims, 9 Drawing Figures

SWITCHING CIRCUITS PARTICULARLY USEFUL FOR ANALOG-TO-DIGITAL CONVERTERS

This is a division, of application Ser. No. 131,748, now U.S. Pat. No. 3,733,600, filed 4/6/71.

CROSS REFERENCES TO RELATED APPLICATIONS

This

1. Application Ser. No. 649,161 entitled "Triple Integrating Ramp Analog-to-Digital-Converter" by H. B. Aasanes filed June 27, 1967, now U.S. Pat. No. 3,577,140, and assigned to the same assignee as this application is directed to apparatus for performing multiramp analog-to-digital conversions.

2. Application Ser. No. 131,749 entitled "Bipolar Conversion Analog-to-Digital Converter" by J. J. Belet and J. L. Quanstrom, now U.S. Pat. 3,737,893 filed concurrently with this application, and assigned to the same assignee as this application, is directed to apparatus for permitting bipolar analog input signal operations without sensitivity to small increment signals around zero level.

3. Application Ser. No. 715,812 entitled "Integrating Ramp Analog-to-Digital Converter" by T. J. Harrison filed Mar. 25, 1968, now U.S. Pat. No. 3,582,947, and assigned to the same assignee as this application is concerned with circuitry for permitting dynamic changing of sampling periods and levels in multi-ramp analog-to-digital conversion circuits.

BACKGROUND OF THE INVENTION

1. Field of the Invention

This invention relates to circuits useful for improving operations for converting sampled analog signals into an appropriate format for use in digital data handling equipment. More particularly, this invention relates to an improvement for analog-to-digital conversion circuits which require switching operations between one or more analog input signals and one or more reference voltage or current sources during the course of the conversion operation. The invention is particularly useful for reducing the sensitivity to transients, component drift and the like in analog-to-digital circuits which require various switching operations during the conversion process. One feature of this invention relates to constant resistance switching of semiconductor elements such as MOSFET's.

2. Description of the Prior Art

To permit handling by digital data processing equipment such as computers, the analog signals generated by various condition sensing devices must be converted into digital form. The analog-to-digital converters generally operate on a principle involving the comparison of the analog signal which is an unknown variable quantity against one or more standard reference signals of known magnitudes. These ADC circuits can be generally classified as either successive approximation type converters or multi-ramp integrating converters. A dualramp ADC is shown in the January, 1963 IBM Technical Disclosure Bulletin (Vol. 5 No. 8) at pages 51–52 in the article entitled "Analog-to-Digital Converter" by C. H. Propster, Jr. The conversion speed of such integrating ADC circuits has been markedly increased by using sequential applications of different reference level sources to the integrator following the initial analog signal sampling period. This multiple ramp concept is shown in the aforementioned Aasnaes U.S. Pat. No. 3,577,140 noted above as cross-reference (1).

The prior art ADC circuits frequently are associated with a multiplexer arrangement wherein a plurality of analog signal generating sources are sequentially or selectively sampled for conversion. Further, the ADC circuits whether they be successive approximation or ramp type converters generally require several switching arrangements at the input of the ADC circuit during a conversion cycle. For relatively slow speed operation, the prior art ADC circuits have been frequently satisfactory.

The data processing equipment such as computers can generally handle digital bytes of data at an extremely fast rate. Particularly in the data acquisition and control system arts, it is thus essential that as large a number of analog input signals as possible be sampled in any given period of time. This means that the length of time required for a conversion cycle must be kept to a minimum as well as the time between samples from the multiplexer. As the operating speed is increased, the accuracy of the prior art ADC circuits is seriously impaired by switching transients, resistance variations from the switching operations, noise and various other problems associated with the high speed operations and the necessary operating bandwidth involved particularly for integrator type ADC circuits. One arrangement for reducing the adverse affects of component drift by performing an initializing sequence prior to each conversion cycle is shown in the September, 1968 IBM Technical Disclosure Bulletin (Vol. 11 No. 4) at pages 386–387 in the article entitled "Integrating Ramp Analog-to-Digital Converter" by Aasanes et al.

SUMMARY OF THE INVENTION

This invention is concerned with improvements in analog-to-digital converters which permit accurate data generation with significantly increased operating speeds. Sensitivity to switching transients is reduced by utilizing a special time-out function in conjunction with each switching operation to effectively suspend the normal converter sequence until the switching transients have settled out. The transients are further reduced by clamping the reference sources during switching. In conjunction with a multi-ramp integrating ADC the integrator also is clamped during switching to prevent any output level changes.

The ADC circuits frequently must remain in a quiescent state between conversion cycles such as to accommodate the finite time required foR multiplexing the analog input signals. The present invention further includes means for retaining the ADC at a simulated operating level during these quiescent periods so that the initiation of a conversion cycle is effected at a relatively constant level, unaffected by drifting of the circuit components. Still another feature of the present invention which is particularly useful for the multi-ramp converter environment relates to initiation of a conversion cycle by simulating at least the final portion of a conversion cycle before the actual conversion cycle is initiated. That is, at least the last integrating ramp of a reference source is performed and employed to generate a threshold signal indicating that the actual conversion cycle can be commenced. This permits the initiation of the actual conversion cycle and its conclusion to be effectively at the same levels.

It has been found that changes in the resistance of semiconductor switching elements can reduce conversion accuracy particularly where such switching elements are used to provide the input to the integrator of a multi-ramp type ADC. Thus one feature of this invention pertains to precision switching circuitry wherein the level of the switch control signal is referenced to the level of the input signal which is to be switched.

An object of the present invention is to provide improvements in analog-to-digital converter circuits which permit relatively high speed operations with accurate digital conversion results.

Another object of the present invention is to provide high speed analog-to-digital conversion by removing sensitivity to switching transients.

Yet another object of this invention is to reduce analog-to-digital circuit sensitivity to component shifts or drifting by retaining the operating components at a quiescent state approximating the initial level of conversion cycles.

A further object of the present invention is to provide improved ADC operation at relatively high speeds using a common switch point for both analog and reference sources without sensitivity to switching transients.

A still further object of this invention is to provide an improvement in ADC circuitry by clamping auxiliary reference voltages of similar magnitudes to te reference voltage sources during switching transients such that the source impedance of the bias voltages is relatively low at high frequencies and the source impedance of the reference voltage is resistive and relatively constant at all frequencies.

An additional object of this invention is to provide a precision switch control for effecting relatively constant resistance switching through a semiconductor element.

The foregoing and other objects, features and advantages of the present invention will be apparent from the following more particular description of the preferred embodiment of the invention as is illustrated in the accompanying drawings.

DESCRIPTION OF PREFERRED EMBODIMENTS

Figure 1:
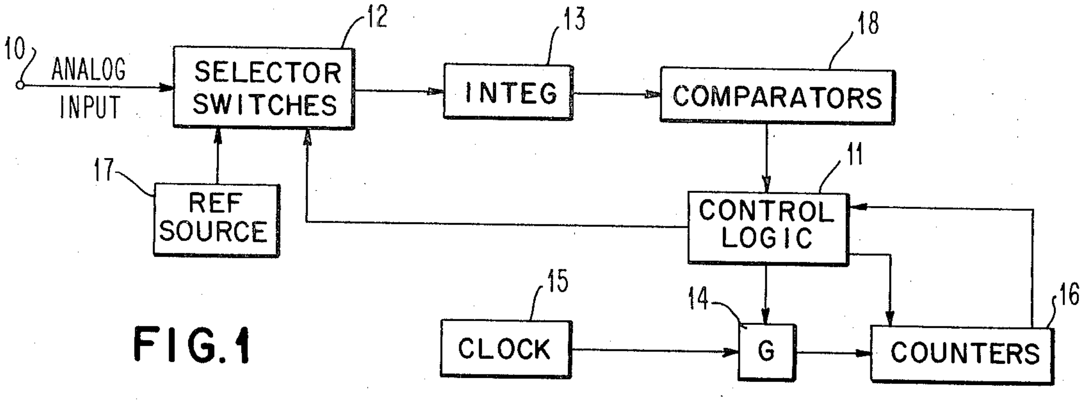
FIG. 1 presents a general block diagram of the components associated with an embodiment of the present invention.

The general block diagram of FIG. 1 contains the components associated with incorporating the present invention in a multi-ramp integrating analog-to-digital converter. Although the preferred embodiment will be illustrated and discussed in detail particularly in FIGS. 3 and 5 using triple-ramp integrating operation such as is disclosed in the aforementioned Aasanes U.S. Pat. No. 3,577,140, it will be readily recognized by those having normal skill in the art that the invention is adaptable for use in various other ADC configurations such as dual ramp ADC's and the like. The sampled unknown analog input signal, V*x*, is coupled to terminal 10 and could be produced from selected outputs of a multiplicity of sensor elements such as from a multiplexer output. The analog input at 10 is to be converted to a digital word of data for utilization by data process type equipment. As is known in the multi-ramp ADC art, Control Logic 11 initiates a conversion cycle by closing an appropriate switch in switch matrix 12 so that V*x* is introduced to integrator circuit 13. This integration of V*x* is indicated as commencing at time *t*1 in FIG. 2. As is discussed in greater detail in the concurrently filed and copending Belet et al application cross-referenced hereinbefore, the polarity of V*x* can be initially sampled and Control Logic 11 can respond so that the polarity of input signals for integrator 13 will be relatively constant.

Concurrently with the initiation of integration of V*x* at *t*1, logic 11 will actuate gate 14 so as to commence introducing timing pulses from clock 15 into counters 16. Counters 16 will eventually generate a pulse indicating that a preselected sample time period has occurred and logic 11 will respond by ending the Vx sample period at t2. The sampling period *t*1 - *t*2 can be fixed or could be variable as is taught by the Harrison U.S. Pat. No. 3,582,947, also mentioned in the cross-references above. Logic 11 responds to the end of the sampling period by switching appropriate levels from reference source 17 so as to clamp the integrator 13 level for a brief period of time as is indicated by the *t*2 - *t*3 plateau in FIG. 2. This permits the integrator 13 to be clamped while the switches in matrix 12 are settling and thus removing the possibility of transients distorting integrator 13 output. In addition, the switch selections at 12 are controlled during the *t*2 - *t*3 interval so that an appropriate reference voltage from reference source 17 is switched into the input of integrator 13. Note that control logic 11 generates other plateaus such as *t*0 - *t*1, *t*4 - *t*5 and the plateau following t6 all of which are for similar operation supending and/or isolating functions while switch connections are being set up.

Control Logic 11 includes means for generating a signal indicating that these fixed periods have passed. When *t*3 is indicated as having occurred, Logic 11 will actuate matrix 12 such that a reference voltage from source 17 is coupled into integrator 13. The ouput of integrator 13 will begin dropping as shown in *t*3 - *t*4 of FIG. 2 with the threshold level associated with comparator 18 indicating the occurrence of the threshold level associated with *t*4. Again, the fixed period timing means is actuated in Logic 11 to define the *t*4 - *t*5 transition period to allow clamping of integrator 13 while the transients are settling out in matrix 12. At $t5$, a second reference voltage of a lesser magnitude than the first reference voltage is coupled to the input of integrator 13 through matrix 12.

Figure 2:
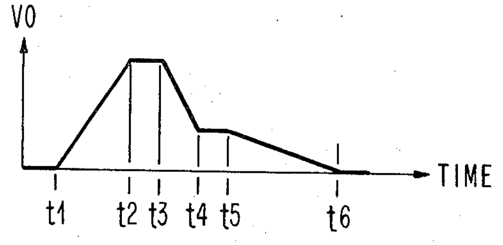
FIG. 2 is an idealized time-base diagram of the output voltage for the integrator of FIG. 1.

With the smaller reference voltage applied after $t5$, the integrator output will ramp downwards at a slower rate as is shown in FIG. 2. Ultimately comparator 18 will indicate that the initial or starting level has been reached at $t6$ so that the conversion cycle has been completed. As is described in greater detail in U.S. Pat. No. 3,577,140 by Aasnaes, counters 16 can be blocked into high and low order segments which are incremented during the $t3$ - $t4$ and $t5$ - $t6$ time spans, respectively. It should be noted that the polarity of reference signals from source 17 as is utilized for the $t3$ - $t4$ and $t5$ - $t6$ integration would generally be of opposite polarity from the analog input V$x$.

Particularly when utilized in data acquisition and control environments, it is highly imperative that the number of analog signals sampled in a given period of time be as large as possible. This means that the length of time required for completion of each analog-to-digital conversion cycle must be kept to a minimum. The prior art multi-ramp ADC circuits such as is shown in Aasanes U.S. Pat. No. 3,577,140 are generally satisfactory provided relatively low speed of analog input sample multiplexing is effected. However, attempts to increase the speed of the multi-ramp ADC circuits gives rise to a series of significant problems. These problems relate to switch timing, switching speed, transients in the precision reference network, resistance variations in the switches, integrator bandwidth and slew rate requirements, noise at the integrator output and problems associated with starting a conversion cycle. The resolution of these problems is provided by the present invention and will be more fully understood from the following descriptions.

Figure 3:
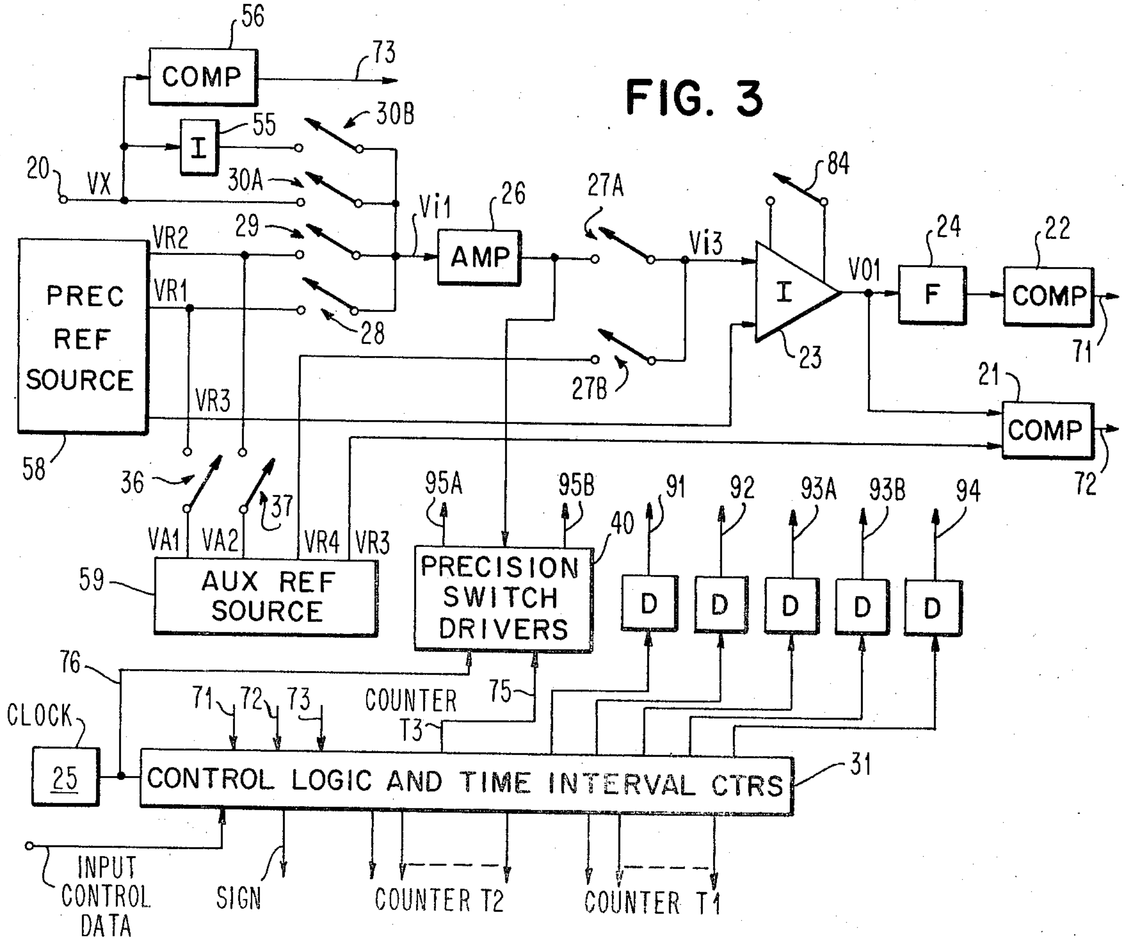
FIG. 3 illustrates circuitry for embodying the present invention in a triple-ramp integrating analog-to-digital converter.

FIG. 3 shows a diagram of a triple-ramp integrating ADC operating similar to that described in the Aasanes patent. That is, for an $n$-bit converter, with a clock 25 frequency of $fc$, an input signal at 20 (−Vx) is integrated by integrator 13 for a fixed period of time defined by $2/fc$ $n/2$ measured by obtaining a full count N1 in counter T1. This is followed by integration of reference voltage VR2 until comparator 21 stops counter T2 at count N2 a time N2/$fc$ later. A second reference voltage VR1 is then integrated until comparator 22 stops counter T2 at count N3 a time N3/$fc$ after the end of the N2 count. With the improvements described in the aforementioned Belet and Quanstrom application providing an integrator bias voltage VR3, the converted output digital code N4 becomes for the simplified first-order case:

N4 = N1 N2 + N3 = 2* ($n$) (-V$x$ − VR3)/ (VR2-VR3) The equation shows the output code N4 is directly proportional to V$x$ (which is chosen negative) biased by constant voltage VR3. The bias can be subtracted digitally from the output code by presetting the N2 count, as explained in the copending Belet and Quanstrom application.

Buffer amplifier 26 with unity voltage gain is coupled by a single precision switch composed of switch contacts 27A and 27B to control the connection of the three main input signals V$x$, VR2 and VR1 to integrator 23 in sequence. Also, the integrator input is now blocked from receiving irregular and inaccurate signals during the changing of the input signals from one state to another by the set of selector switch contacts 28, 29, 30A and 30B. The precision switch 27 thus operates for a fixed period of time 2*(4)/$fc$ determined by filling a counter T3 in control logic 31 between each of the previously normal integration periods, thus allowing the selector switch transients to settle out and allowing the buffer amplifier 26 to slew and settle.

Figure 4:
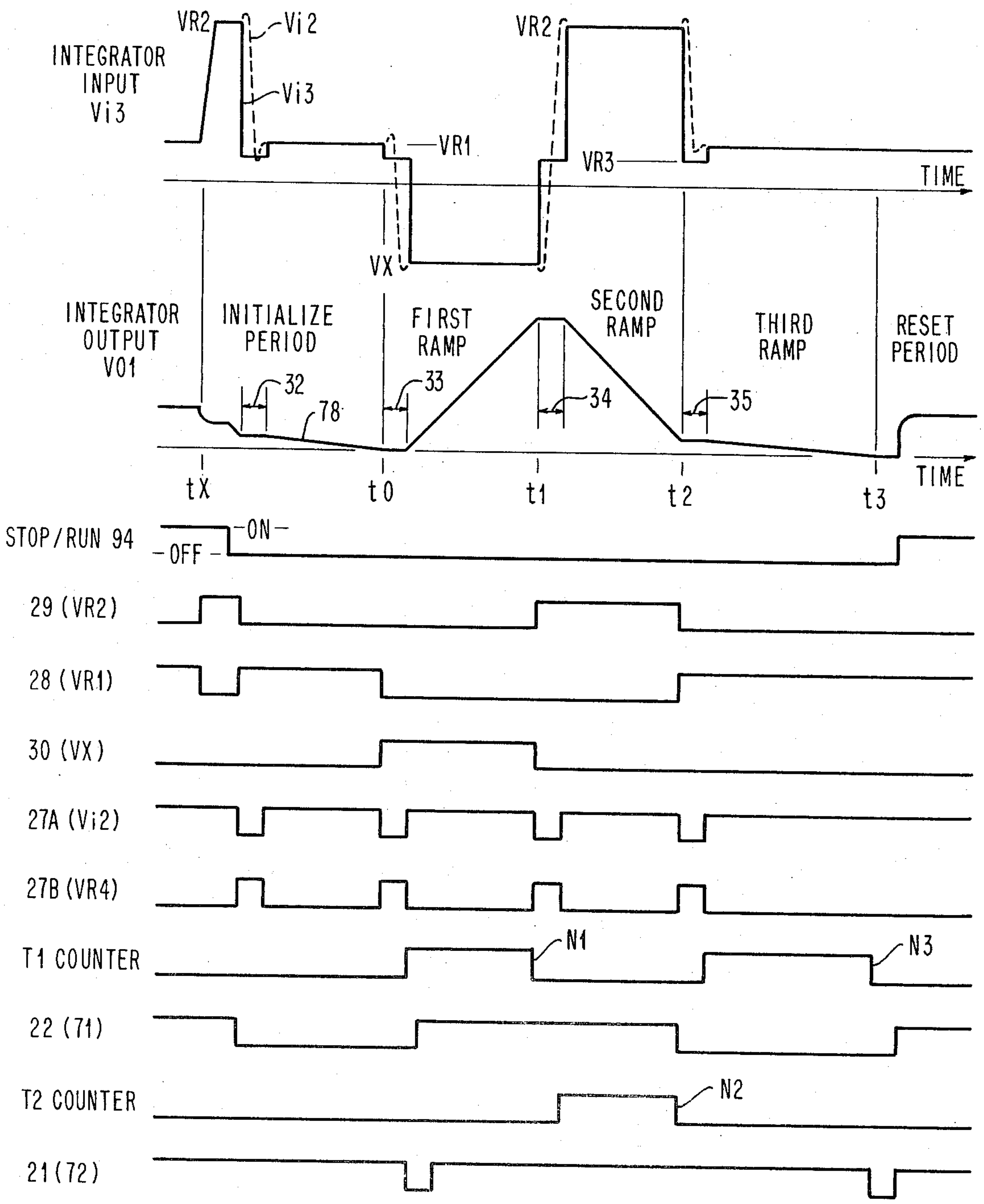
FIG. 4 depicts the time-base output levels of various components in the FIG. 3 circuitry.

The time waveform of the integrator output voltage Vol shown in FIG. 4 is characterized by short portions 32 – 35 with small or zero slope before each ramp. These time delay plateaus 32 – 35 are caused by the integrator input voltage Vi3 being switched momentarily via switch 27 to a voltage VR4 which is close to the integrator bias voltage VR3. This primary improvement in providing precision switching for the integrator input will be more fully described hereinafter, along with the several other improved features for providing high-accuracy performance from the basic triple-ramp integrating ADC.

Figure 5:
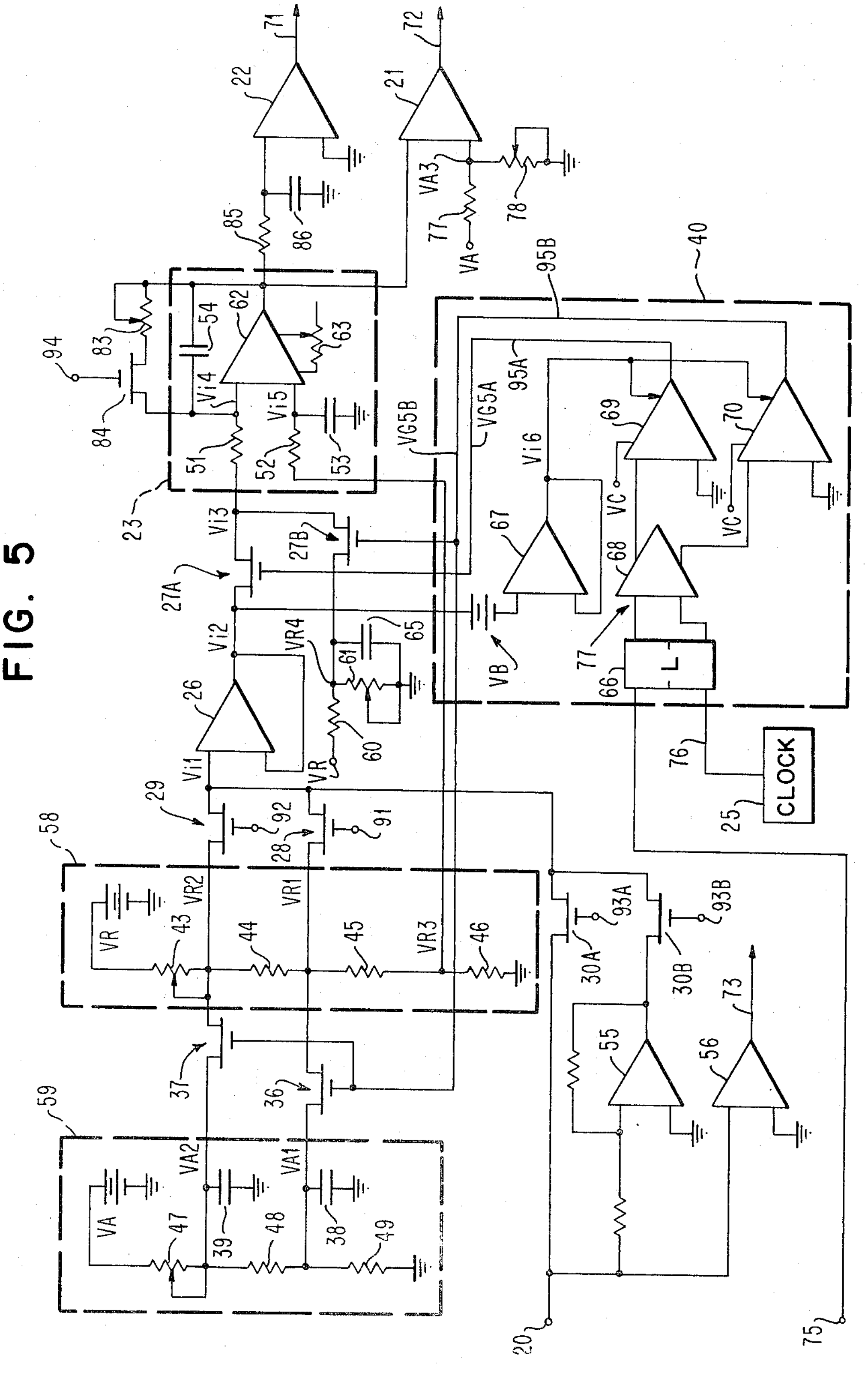
FIG. 5 contains somewhat greater detail of the circuitry which might typically be utilized in an embodiment such as is shown in FIG. 3.

The analog signal section of the integrating ADC of FIG. 3 is shown in block diagram and partial schematic form in FIG. 5. In order to prevent large transients from occurring on the reference voltages VR1, VR2, and VR3 while the input signal Vi1 is being switched by MOSFET switches 28, 29, or 30, the two reference voltages VR2 and VR1 are clamped during transitions in Vi1 by MOSFET switches 36 and 37, respectively, to auxiliary voltages VA1 and VA2, as shown in FIG. 5. The auxiliary voltages have capacitors 38 and 39 shunting to ground to store the charge from switching transient currents from MOSFET's 28 and 29, rather than force the charge through reference network resistors 43, 44, 45 and 46. Clamp switches 36 and 37 are conducting only during the transitions in input voltage Vi1, after which the stored charge on capacitors 38 and 39 is discharged harmlessly into auxiliary resistors 47, 48, and 49, leaving the reference voltages VR1, VR2, and VR3 to recover with a very short time constant to their correct voltages after the clamp switches 36 and 37 are driven off. A primary cause of transients on the reference voltages is the stray shunt capacitance on the Vi1 node.

Stable resistor 43 is varied to calibrate all three reference voltages and obtain the desired ADC gain calibration. Resistor 47 is varied to produce approximately the same auxiliary voltages VR1 and VR2, but the auxiliary voltages need not be precisely regulated. Capacitors 38 and 39 values are chosen to provide time constants with their shunt resistors which are much smaller than a conversion cycle time, but much longer than the duration of the switching transients.

When the input voltage Vi1 selects in time sequence the unknown input voltage V$x$, then the large reference voltage VR2, and finally the small reference voltage VR1, it is difficult in practice to provide ideal transitions between the voltages which are both free of transient aberrations and which are located at the proper time. Also, since the MOSFET switches 28, 29 and 30 must drive the integrator input resistor 51, the "on" resistances of the three switch devices forms three different unknown voltage dividers with the integrator input resistor 51 causing errors in the integrator input current both as a function of the particular switch which is conducting, and also as a function of the unknown current through the switch when the unknown input voltage V$x$ is being integrated. This integral of these timing and amplitude errors is significant in practice, causing conversion errors not encountered in the slower multi-ramp ADC operation.

If the voltage-following buffer amplifier 26 with unity voltage gain is driven by voltage Vi1, the amplifier 26 in turn driving the integrator resistor 51, input timing errors and slew-rate limited transitions at the amplifier output still cause large errors in the integral, whereas the variable "on" resistances of 28, 29 and 30 no longer produce an error from their voltage drops. A second set of MOSFET analog switches 27A and 27B after buffer amplifier 26 corrects the timing of the signals actually driving the integrator resistor 51. The timing is controlled by a gate-voltage driver 40 which provides extremely short and accurately located rise and fall times to control the MOSFET switches 27A and 27B. The integrator input signal timing is thus controlled entirely by a single pair of switches acting as a single-pole double-throw switch, with only a single switch device 27A driving the voltage Vi3 across the integrator input resistor 51 for all input voltages selected at Vi1.

With an appropriate buffer amplifier 26 with stable linear gain of approximately unity, stable offset voltages and currents, and adequate slew-rate and bandwidth, only the switch 27A can yet contribute error to the integrator input current due to nonlinear changes in "on" resistance and its voltage-divider action with the integrator resistor connected between Vi2 and the virtual ground at the integrator summing point Vi4. However, the conversion accuracy of the multiple-ramp integrating converter is known to be insensitive to the value of integrator resistor 51 if it is constant and, therefore, the "on" resistance of 27A will now now cause an error if it is also constant for all currents conducted into the integrator, and during each conversion cycle. An arrangement for achieving constant switch resistance will be considered later.

When the input voltage Vi1 is being switched and the amplifier 26 has its output voltage at Vi2 slewing and settling, the integrator input voltage Vi3 is switched by the MOSFET 27B to a stable reference voltage VR4, derived by precision resistors 60 and 61 from the same precision reference voltage VR4 mentioned previously, and bypassed to ground by a capacitor 65. The RC time constant of 61 and 65 is chosen small compared to the time that switch 27B is conducting but long compared to the rise time of the gate drive voltage for switch 27B.

A bias potentiometer 63 is employed in integrator amplifier 62 to compensate for both the buffer amplifier 26 and the integrator amplifier 62 offset voltages and currents, whereas the potentiometer 61 adjusts the remaining offset effects from switch timing to zero by controlling the voltage applied to the integrator input during the constant duration switching intervals.

The integrator input is biased by returning its reference input voltage Vi5 to precision reference voltage VR3, as discussed in the aforementioned copending Belet and Quanstrom application to implement the procedure for converting input signals of either polarity. Precision inverting amplifier 55, comparator 56, and switches 27A and 27B are also involved in the polarity detecting and handling scheme. The integrator bias voltage VR3 is connected through resistor 52 and capacitor 53 for integrator compensation with element values equal to resistor 51 and capacitor 54, respectively.

Next the operation of the precision switch drive 40 will be considered. As mentioned before, the one remaining source of error involved in presenting the input signals to integrator 23 at the proper time and with the proper amplitude centers on the single component, MOSFET switch 27A. It must be switched rapidly and at precisely controlled times, and it must present a constant "on" resistance when conducting.

A unique gate drive circuit 40 accomplishes both of these requirements in combination with a precisely-timed logical input signal for determining which state of conduction is intended for the switches 27A and 27B. Note that switches 36 and 37 are shown driven from the same drive as 27B for convenience, but a precision switch drive for 36 and 37 is not required. The drive circuit is shown in FIG. 5 providing a gate voltage VG5A for driving switch 27A into conduction with a gate-to-channel control voltage VB which is constant and independent of the voltage Vi2 driving the MOSFET. This is accomplished by referencing a driven power supply voltage Vi6 to the output voltage Vi2 of the buffer amplifier 26, and then using this driven supply for power for two wideband amplifiers 69 and 70 whose output voltages saturate in either direction at the power supply voltages.

Figure 6:
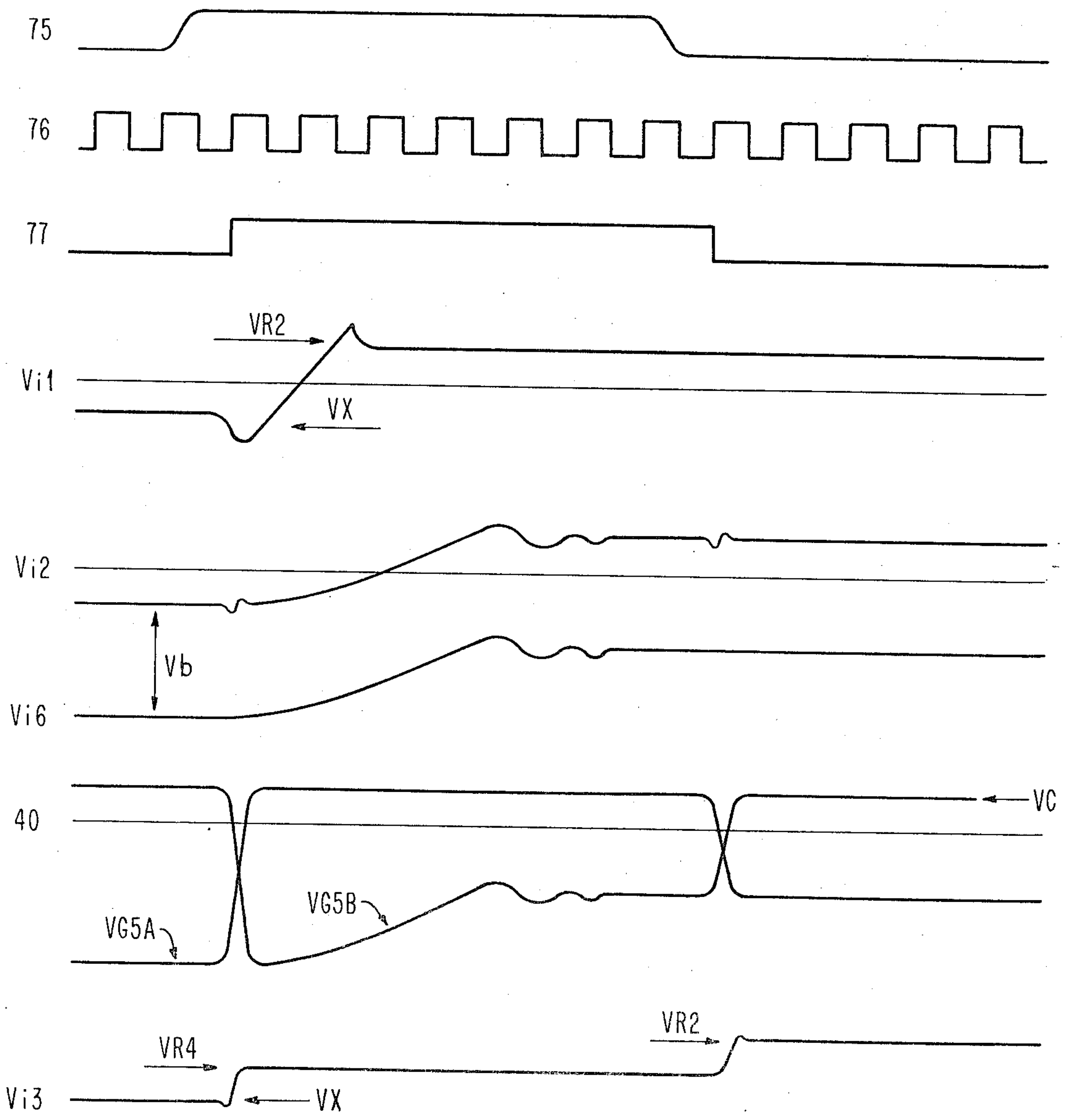
FIG. 6 shows typical operating waveforms for the precision switch drive components of FIGS. 3 and 5.

The output voltages VG5A and VG5B of these two wideband amplifiers 69 and 70 thus swing between voltages VC and Vi6 = Vi2 - VB in response to the input binary control signal 75, as shown in the time waveforms of FIG. 6. This prevents the drain-to-source "on" resistance from varying significantly with input voltage Vi2 which it would ordinarily do with conventional gate-voltage drive circuits.

The timing of the 27A and 27B switching transitions is accurately controlled in part by utilizing a logic clock or oscillator 25 with excellent short-term stability. Over the time of several hundred cycles of the oscillator frequency required for one conversion cycle of the ADC, the period of each oscillator cycle should be as constant as can possibly be achieved. This is done with a fundamental crystal used as a positive feedback network around a current-switching logic element. The logical control signal 75 coming from the control circuit 31 of the ADC is delayed until the next clock transition by a coincident logic trigger or latch 66 such that the output logic command 77 has an accurately timed transitions as possible Then, wideband, balanced preamplifier 68 produces both polarities of output signals with a small, stable, and equal delay between input and output transitions. The two polarities of control signals are each amplified further by gate drive amplifiers 69 and 70, each being an identical wideband amplifier with small, constant, and equal delay between input and output transitions of either direction. Thus, the transitions in the gate drive voltages VG5A and VG5B occur at times closely controlled on a short-term absolute time scale derived as directly as possible from the stable clock output 76.

An integrator amplifier with relatively high performance characteristics is required for a high-accuracy integrating ADC. A slew rate specification of ten or more times the slope of the integral is desirable and, of course, very small coefficients of change in input offset voltage and current are required. Although it was previously believed that a limited response bandwidth in the integrator was unsatisfactory, it has been determined that a relatively narrow response bandwidth can indeed be used if the circuit is extremely linear. Filter 24 including a passive resistor 85 and capacitor 86 are used following a wide-bandwidth integrator 23 to provide a linear band limit for reducing the uncertainty and noise in the ADC resulting from both random and digital interference. Digital clock noise can create gross nonlinearities while random noise from the integrator amplifier can produce poor repeatability without the use of linear filter 24.

Another problem in implementation of the triple-ramp ADC involves the beginning of the conversion cycle. The cycle must be started and ended with identical conditions in order to obtain cancellation of errors from comparator 22 offset and delay, and errors from integrator bandwidth as mentioned above. This error cancellation is generally present if it is assumed that the ADC would be operating continuously, that is, where the end of the third ramp of one conversion would always be used as the beginning of the first ramp of the next conversion. Although this is a perfectly good approach for obtaining theoretical maximum speed of conversion, it is not practical in multiplexing, computer-controlled environment, among others, especially since the conversion time is not constant.

A stop conversion condition is provided in accordance with the present invention by the conduction of a MOSFET switch 84 connected shunting the integrator capacitor 54 as shown in FIG. 5. The MOSFET is held out of conduction by its gate drive 94 during the running of a conversion cycle. The input voltage to the integrator during a stop period is selected to be VR1 as this voltage causes amplifiers 26 and 62 to stay in a quiescent state close to the average signal conditions occurring during a conversion cycle. This prevents thermal transients in the signal amplifiers 26 and 62 that are a function of the time between conversions. Upon initiating a conversion, VR2 is applied to integrator 26 momentarily to change the output voltage Vo1 of the integrator amplifier 62 to be a particular voltage as selected during calibration by adjustment of potentiometer 83. The initialization cycle preparatory to an A/D conversion is illustrated in FIG. 4. This initialization sequence starts with VR2 being switched into integrator 23 at time tx. Shortly thereafter, the bypass is removed from integrator feedback capacitor 54 by logic 31 deactuating switch 84 while continuing to actuate switches 27A and 29. The ADC is allowed to function as if a normal ADC cycle was in effect in that V01 will drop in response to VR2, the switching time delay 32 occurs and thereafter VR1 is switched into integrator 23 so as to proceed to the third ramp 78. Upon completion of the initializing third ramp 78 and the following time delay 33, the proper initial conditions exist for the subsequent start of the actual first ramp. This initializing cycle introduces a delay in the start of conversion during which time the multiplexer and amplifiers proceding the ADC settle out. Also, the initializing period is used to provide adequate time for several second-order, low-amplitude, slow transients in the ADC to settle out following the previous conversion cycle. Thus, the adjustment of the initializing time, the length of which is primarily determined by the setting of resistance 83 is an important part of calibration of the ADC.

The offset or zero level of the ADC is controlled first by adjusting the zero offset of integrator amplifier 62 to zero the net offset of amplifier 26 and integrator amplifier 62 together. This is done with the converter stopped but with the stop/run switch 84 nonconducting. Then the ADC is cycled with zero input at V*x*, and the desired zero output code is obtained by adjusting the voltage VR4 which is applied to the integrator during the switching intervals, the total time of such intervals always being the same in a conversion cycle. This adjustment of the momentary integrator input during switching compensates primarily for offset errors due to fixed delays in the precision switch circuitry. The effective gain of the converter is varied as already mentioned by adjusting potentiometer 43 in FIG. 5, this adjustment controlling proportional changes in VR1, VR2, and VR3. The state of the various switches and the timed sequence of their operation can be identified in FIG. 4 since the various diagrams are correlated with each other with respect to time. It should be noted that the reference numeral indicated on the left margin generally represents the particular switch component and the bracketed data following it reflects the particular voltage level being coupled to its output. That is, the waveform for "27A (Vi2)" means that switch 27A is conducting whenever the line level is up and at that time the Vi2 output of amplifier 26 is being coupled to integrating amplifier 62. Further, N1 designates the point where the first T1 counter content defining the sample period has been completed, N2 represents the point where the high order counts are contained in the T2 counter and N3 corresponds to the point in time where the T1 counter contains the final ADC count.

The operation of polarity detecting comparator 56, the decision as to whether to directly couple V*x* or to use the unity gain inverter stage through inverter 55 via 30A or 30B as well as the presetting operation to compensate for the application of VR3 to integrator 23 are discussed in detail in the cross-referenced Belet and Quanstrom application.

Figure 7:
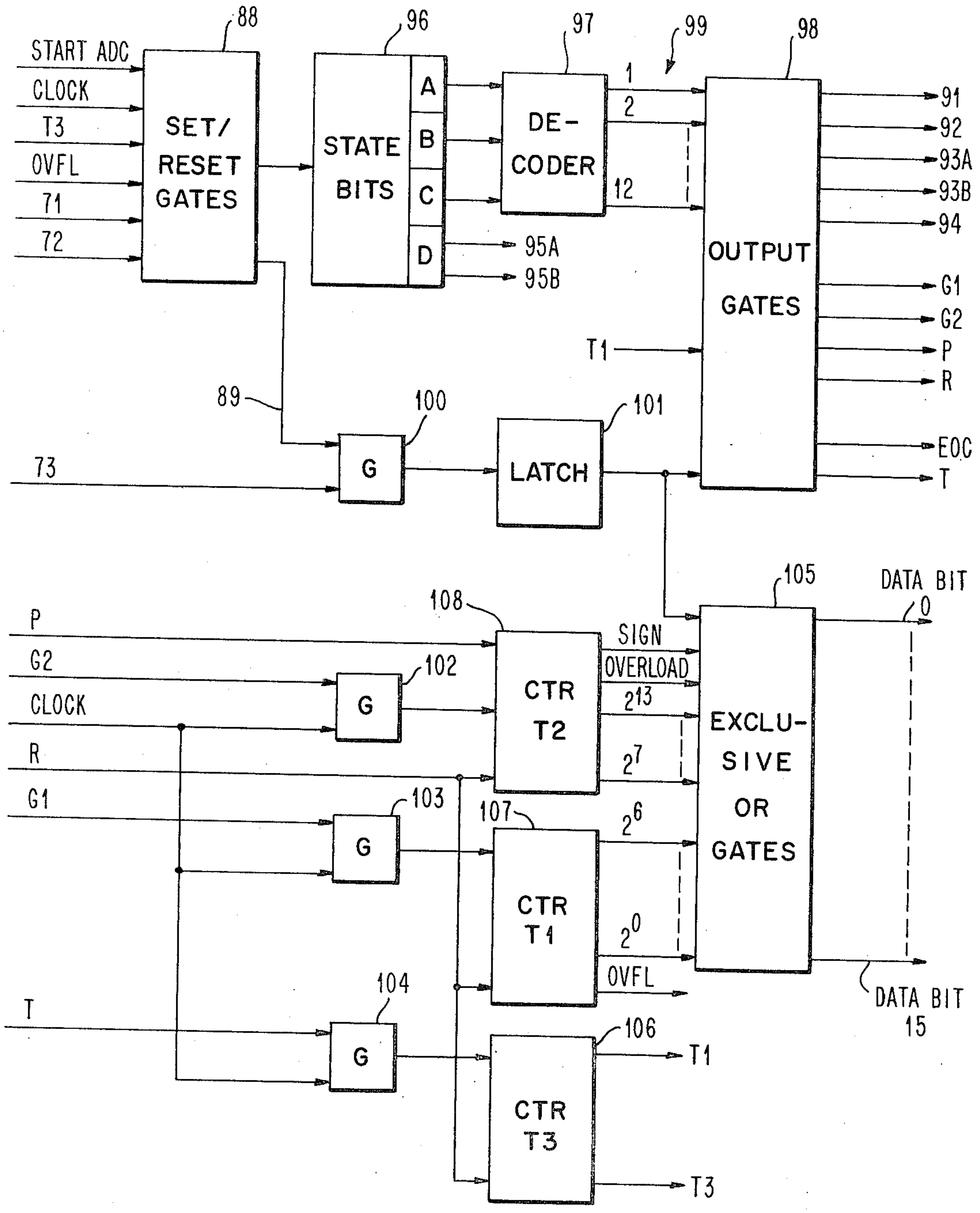
FIG. 7 sets forth a general block diagram of the control and counter logic utilized in the FIGS. 3 and 5 embodiments.
Figure 8:
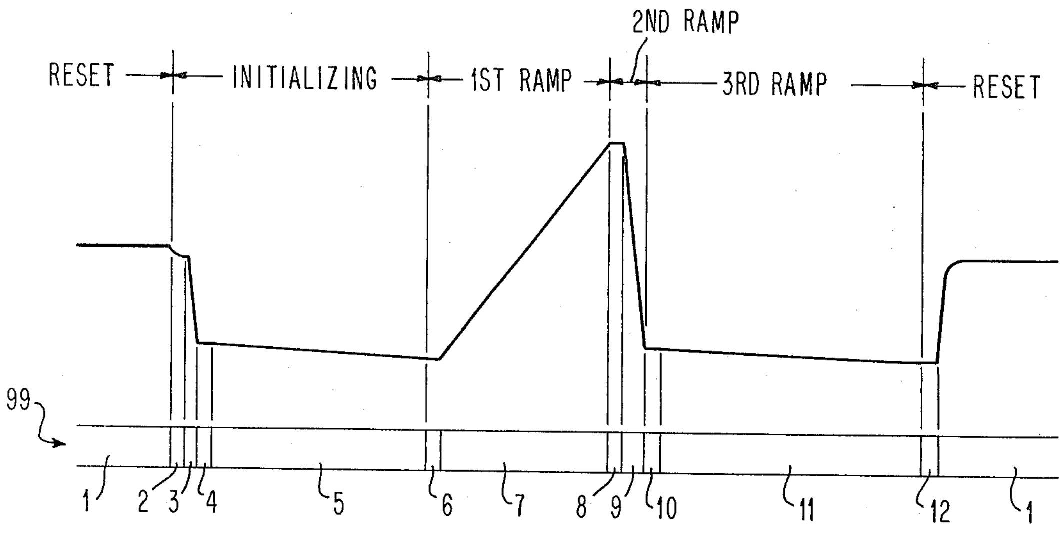
FIG. 8 correlates the integrator output levels in FIGS. 3 and 5 with the ADC state conditions decoded in FIG. 7.
Figure 9:
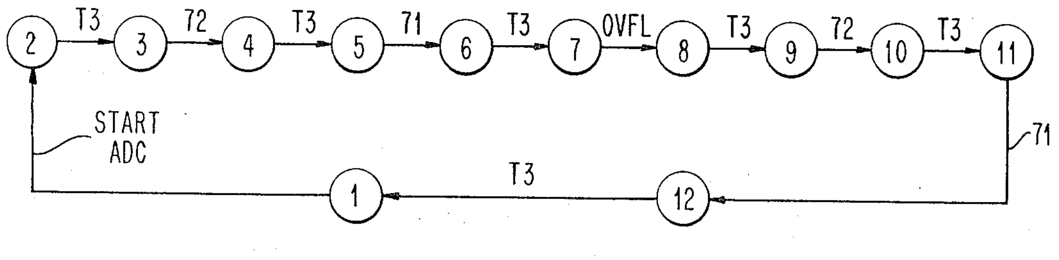
FIG. 9 is an idealized loop illustrating the sequence of events which determine the transition from one state to another in correlation with FIGS. 7 and 8.

The control logic and time interval counters 31 shown in FIG. 3 can be implemented through structure in accordance with the general block diagram of FIG. 7. The set/reset gates 88 logically respond to each of the inputs shown to set the state bits 96 (A, B, C, and D) into their appropriate states and also to permit sampling of the polarity determination by generating an input signal 89 into gate 100 to sample the condition of comparator 56 output 73. That is, the signal is present on 89 during the transition between state 5 and state 6 (note FIG. 8) which will be discussed further hereinafter. In response to this sampling of gate 100, polarity latch 101 will either be set or left in a reset condition as a function of the signal on 73. As can be seen from the following Table I, set/reset gates 88 also interpret the previous condition of state bits 96 as well as the existing state as indicated by the outputs 99 of decoder 97. In Table I, the numbers 1 through 12 indicate the state condition 99, L1 indicates signal 71, L2 indicates signal 72, ST represents the presence of a start ADC input command, C designates a clock pulse, RB represents a system reset and F is the overflow (OVFL) of counter T1. Note that both the ST and RB signals originate from control apparatus not shown. In addition, Rx is defined by the following equation:

$$Rx = [(12)\ T3 + RB]\ (1)$$

Accordingly, the control logic state definition is as follows:

TABLE I

| | SET | RESET |
|---|---|---|
| A | (4+5)D | Rx |
| B | (2) L2 T3+(10+11) D | (6+7) D+Rx |
| C | (1) ST+(8+9) D | (3) D+Rx |
| D | [(3+9) L2+(5+11) L1+(7) F]C | T3C+Rx |

In response to the particular set or reset conditions of state bits 96, control signals 95A and 95B for actuating or deactuating switches 27A, 27B, 36 and 37 of FIG. 3 are responsive to the set condition of bit D. That is, in correlation with TABLE II below, the set state of bit D will cause the deactuating of switch 27A and the introduction of conduction signals to switches 27B, 36 and 37 in response to 95B. The converse is true whenever switch D is reset or in a zero condition.

Decoder 97 interprets the state of each of bits A – D and raises one of the state indicating lines 99 to flag the particular state 1 – 12 in which the ADC resides at any given moment. These states are likewise indicated by the horizontal columns for decoder output 99 in FIG. 8 wherein they are correlated with the output of the integrator. Output gates 98 logically respond to the particular one of state indicating line 99 that is raised so as to appropriately pick the output levels for lines indicated. These output lines such as 91 through 94 perform the specific switching functions discussed hereinbefore with respect to FIGS. 3 and 5, whereas the other outputs (G1, G2, P, R, EOC and T) perform specific control functions in other components of the FIG. 7 circuitry.

For purposes of a brief explanation with respect to Table II below, this table shows the various switching actuations and logical interrelationships in going from one state to another. For instance, the control logic state definition per Table I above and II below responds to the transition from either state 4 or state 5 and the positive transition (setting) of bit D by setting bit A in state bits 96. Further, the existence of state 12 and a T3 pulse from the counter T3 or a system reset RB will cause reset of bit A provided state indicating outputs 99 are in other than state 1.

Counter T3 in FIG. 7 is a 3 bit counter which effectively controls the transition plateaus such as 32 – 35 in FIG. 4. Thus one of the conditions to which output gates 98 logically respond for the existence of a state 2 output at 99 is to generate a signal T so that gate 104 will begin incrementing counter T3. Counter T3 is arranged so as to produce 2 output pulses, one when the first increment is counted at T1 and the second when counter T3 is filled so that the third stage generates a T3 output. As can be seen from Table II below, the T1 output is used by output gates 98 either to preset counters 1 and 2 when in state 8 or, when state 12 has been reached, to indicate that the end of conversion (EOC) has been reached and the byte contained in counters T1 and T2 can be read.

Table II below illustrates the condition of the various control signal levels for the switches in FIGS. 3 and 5 as well as the appropriate output levels used internally by the FIG. 7 circuitry. That is, a "1" specifies that the control signal is causing the switch to be in its conducting state where as "0" indicates that the switch is in its non-conducting state. As mentioned previously, signal T in Table II indicates that the counter T3 is to commence timer operations and the EOC signal specifies that the conversion has been completed. The P means that the counters are to be preset in accordance with the polarity detection compensation feature mentioned in the cross-referenced Belet and Quanstrom application and the R represents a counter reset signal. Signals G1 and G2 are the actuating signals to gate clock pulses into counter 1 and counter 2 through gates 103 and 102 repsectively. Again, the "T1" notations in Table II specify the first count pulses from counter T3 (106) of FIG. 7.

TABLE II

| State | A | B | C | D | 91 | 92 | 93 | 94 | 95 | G1 | G2 | P | R | T | EOC |
|---|---|---|---|---|---|---|---|---|---|---|---|---|---|---|---|
| 1.......... | 0 | 0 | 0 | 0 | 1 | 0 | 0 | 1 | 1 | 0 | 0 | 0 | 0 | 0 | 0 |
| 2.......... | 0 | 0 | 1 | 0 | 0 | 1 | 0 | 1 | 1 | 0 | 0 | 0 | 1 | 1 | 0 |
| 3.......... | 0 | 1 | 1 | 0 | 0 | 1 | 0 | 0 | 1 | 0 | 0 | 0 | 0 | 0 | 0 |
| 4.......... | 0 | 1 | 0 | 1 | 1 | 0 | 0 | 0 | 0 | 0 | 0 | 0 | 0 | 1 | 0 |
| 5.......... | 0 | 1 | 0 | 0 | 1 | 0 | 0 | 0 | 1 | 1 | 0 | 0 | 0 | 0 | 0 |
| 6.......... | 1 | 1 | 0 | 1 | 0 | 0 | 1 | 0 | 0 | 0 | 0 | 0 | 1 | 1 | 0 |
| 7.......... | 1 | 1 | 0 | 0 | 0 | 0 | 1 | 0 | 1 | 1 | 0 | 0 | 0 | 0 | 0 |
| 8.......... | 1 | 0 | 0 | 1 | 0 | 1 | 0 | 0 | 0 | 0 | 0 | T1 | 0 | 1 | 0 |
| 9.......... | 1 | 0 | 0 | 0 | 0 | 1 | 0 | 0 | 1 | 0 | 1 | 0 | 0 | 0 | 0 |
| 10 ........ | 1 | 0 | 1 | 1 | 1 | 0 | 0 | 0 | 0 | 0 | 0 | 0 | 0 | 1 | 0 |
| 11 ........ | 1 | 0 | 1 | 0 | 1 | 0 | 0 | 0 | 1 | 1 | 0 | 0 | 0 | 0 | 0 |
| 12 ........ | 1 | 1 | 1 | 1 | 0 | 0 | 0 | 0 | 0 | 0 | 0 | 0 | 0 | 1 | T1 |

Note that when counter T1 (107) overflows, it provides a control signal OVFL as one input to logic 88. To interpret Table II in correlation with the FIG. 3 circuitry, this indicates that during the reset period its A–D bits are all clear, signal 91 is present so that VR1 is coupled to amplifier 26, signals 92 and 93 are not present so that VR2 and V$x$ are not coupled to amplifier 26, signal 94 is present so that the integrating capacitor is shorted through switch 84 being actuated and the presence of signal 95 indicates that integrator 23 is coupled to the output of amplifier 26. The absence of the other pulses G1, G2 et seq indicates that no other functions are being performed.

As another example, the horizontal line corresponding to state 8 reflects that bits A and D are present while B and C are clear which results in switch 29 being actuated to introduce VR2 to the input of amplifier 26 whereas the "0" for 95 reflects that switch 27B has been actuated and 27A deactuated so that VR4 is coupled to the input of integrator 23. Further, the T1 in the P column reflects that the counters T1 and T2 will be preset at the T1 pulse from counter T3 and additionally the presence of the "1" in the T column specifies that the counter T3 is being incremented.

While the invention has been particularly described and shown relative to the foregoing embodiments, it will be understood by those having normal skill in the art that varios other changes and modifications may be made without departing from the spirit of this invention.

What is claimed is:

1. A switching circuit comprising a switching element including at least one semiconductor device having input, output and control terminals, a constant signal source, means responsive to signals introduced to said input terminal for developing a signal proportioned to the difference between the magnitude of said input signal and the magnitude of said constant signal, and isolating means for coupling said proportioned signal to said control terminal for causing said semiconductor device to present a constant resistance between the said input and output terminals thereof.

2. Apparatus in accordance with claim 1 wherein said switching element is an FET semiconductor device, said proportioned signal developing means is a differential amplifier having one input thereof coupled in offsetting relation by said constant signal to said input terminal of said switching element, the output of said differential amplifier being coupled to the other input of said differential amplifier means, and said isolating means includes an amplifier coupled to receive said proportioned signal as the main driving source thereof with the output of said amplifier providing signals for said control terminal of said semiconductor device.

3. Apparatus in accordance with claim 2 which further includes a source of potential for causing said isolating means amplifier to become nonconducting, a command signal generating means, and means responsive to said command signal for selectably energizing said isolating means amplifier with either said proportioned signal or said potential source, whereby said switching element will be off when said amplifier is energized by said potential source but will have a constant input-output resistance when energized by said porportioned signal.

* * * * *